US 6,727,568 B2

(12) United States Patent  (10) Patent No.: US 6,727,568 B2
Kim  (45) Date of Patent: Apr. 27, 2004

(54) SEMICONDUCTOR DEVICE HAVING A SHALLOW TRENCH ISOLATION AND METHOD OF FABRICATING THE SAME (75) Inventor: Myoung-Soo Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 22 days.

(21) Appl. No.: 10/105,544

(22) Filed: Mar. 25, 2002

(65) Prior Publication Data

US 2003/0042544 A1 Mar. 6, 2003

(30) Foreign Application Priority Data

Aug. 30, 2001 (KR) ......................... 2001-52924

(51) Int. Cl.$^7$ ................................................ H01L 29/00
(52) U.S. Cl. ................. 257/510; 257/344; 257/345; 257/387; 257/389; 257/409
(58) Field of Search ................. 257/344, 345, 257/374, 387, 389, 409, 402, 510, 524, 349

(56) References Cited

U.S. PATENT DOCUMENTS 6,413,823 B1 * 7/2002 Wu et al. .................... 438/270
2002/0190284 A1 * 12/2002 Murthy et al. .............. 257/286

* cited by examiner

Primary Examiner—Minh-Loan Tran
(74) Attorney, Agent, or Firm—Mills & Onello LLP (57) ABSTRACT

The present invention includes a semiconductor device having a shallow trench isolation and a method of fabricating the same. The semiconductor device includes a gate electrode being arranged to cross over the active region. An oxide pattern is interposed between the active region and the edge of the gate electrode. The oxide pattern defines a channel region under the gate electrode. A lightly doped diffusion layer is formed in the active region downward and outward from the oxide pattern, and a heavy doped diffusion layer is formed in a predetermined region of the active region and surrounded by the lightly doped diffusion layer. In the method of fabricating the semiconductor substrate, a trench isolation layer is formed at a predetermined region of a semiconductor substrate to define an active region. A pair of preliminary lightly doped diffusion layers are formed in a line to cross over the active region. Then, oxide patterns are formed to cover at least the preliminary lightly doped diffusion layers. The oxide pattern defines a channel region. A gate oxide layer is formed on the channel region and a gate electrode is formed to cover the channel region and to cross over the active region. The edge of the gate electrode is over the oxide pattern. A heavy doped diffusion layer is formed in the active region of both regions of a gate electrode and shallower than the lightly doped diffusion layer.

7 Claims, 13 Drawing Sheets

Fig. 1

(Prior Art)

Fig. 2

(Prior Art)

Fig. 3

(Prior Art)

Fig. 4

(Prior Art)

SEMICONDUCTOR DEVICE HAVING A SHALLOW TRENCH ISOLATION AND METHOD OF FABRICATING THE SAME

RELATED APPLICATION

This application relies for priority upon Korean Patent Application No. 2001-52924, filed on Aug. 30, 2001, the contents of which are herein incorporated by reference in their entirety.

FIELD OF THE INVENTION

The present invention relates to a semiconductor device and to a method of fabricating the same. More particularly, the present invention relates to a semiconductor device having a trench region for isolation and a local oxidation of silicon(LOCOS) region for reducing leakage current, and to a method of fabricating the same.

BACKGROUND OF THE INVENTION

In a semiconductor device, leakage current results in faulty operation of the semiconductor device. The leakage current includes a gate induced drain leakage(GIDL) current. The GIDL current is generated in a drain region overlapped with a gate electrode.

Figure 1:
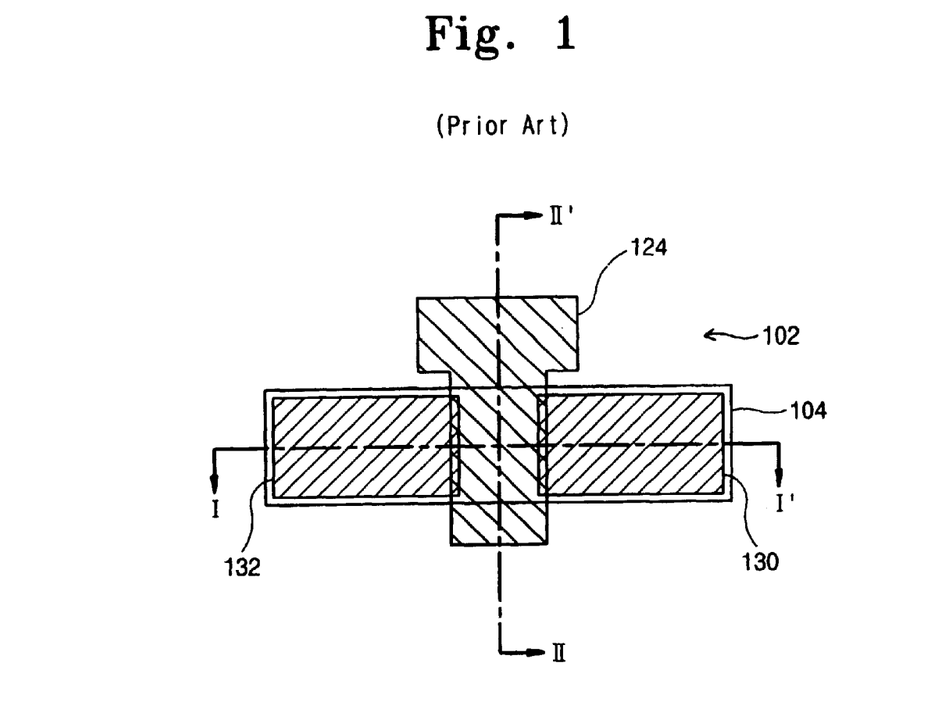
FIG. 1 includes a plan view of a conventional semiconductor device.
Figure 2:
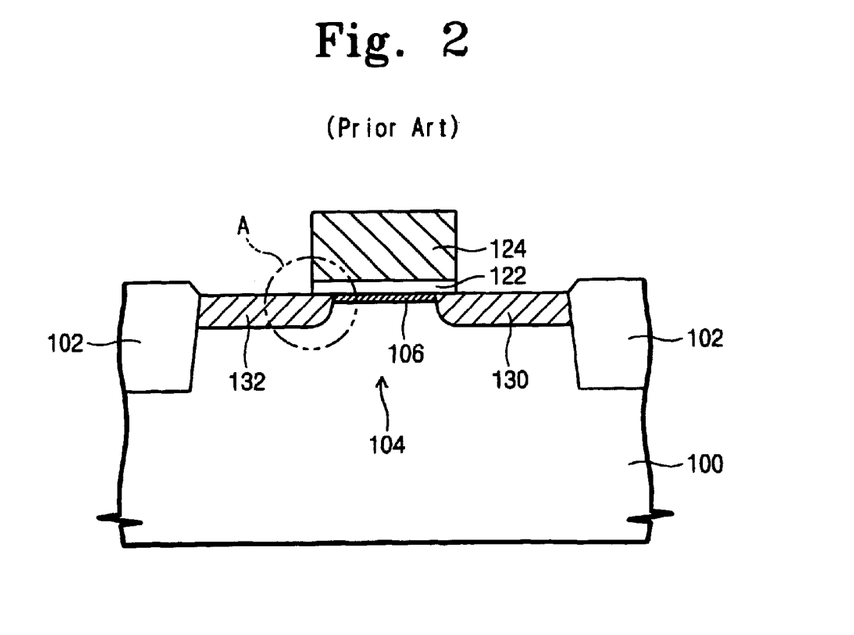
FIG. 2 includes a cross-sectional view taken along an I–I' line of FIG. 1.

FIG. 1 illustrates a plan view of a conventional semiconductor device. FIG. 2 illustrates a cross-sectional view taken along an I–I' line of FIG. 1. Referring to FIGS. 1 and 2, in a general semiconductor device, an isolation layer 102 is formed at a predetermined region of a semiconductor substrate 100 to define an active region 104. A gate electrode 124 crosses over the active region 104. A gate oxide layer 122 is interposed between the gate electrode 124 and the active region 104. A shallow channel diffusion layer 106 is formed in the active region 104 under the gate oxide layer 122. A source region 130 and a drain region 132 are present in the active region 104 adjacent to the channel diffusion layer 106. The source region 130 and the drain region 132 have a region 'A' overlapped with the gate electrode 124.

Figure 3:
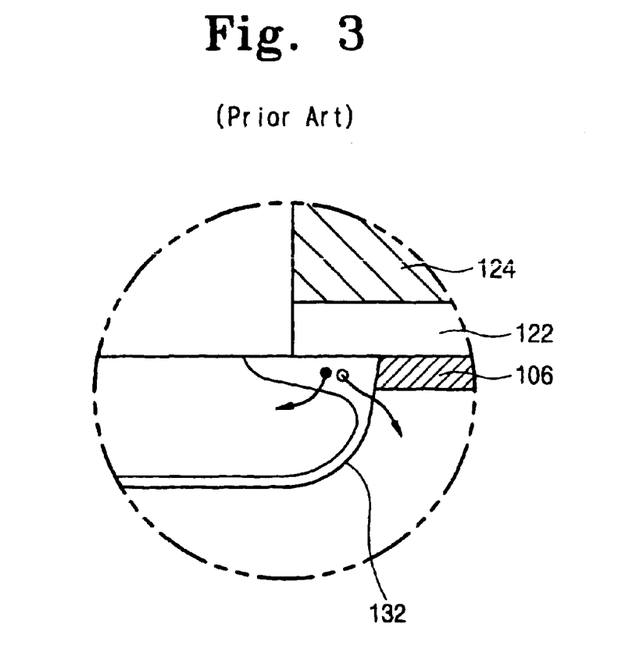
FIG. 3 includes a diagram showing the 'A' region of FIG. 2, illustrating a GIDL current in a semiconductor device.

FIG. 3 illustrates a diagram indicating the 'A' region of FIG. 2 to illustrate a GIDL current in a semiconductor device. Referring to FIG. 3, the GIDL current is generated by a band-to-band tunneling resulting from a high electric field which is induced between the gate electrode 124 and the drain region 132. Thus, electron-hole pairs are generated, so that carriers flow out toward the semiconductor substrate 100 having a relatively lower potential than the drain region 132.

The leakage current also includes a subthreshold leakage current meaning that a current flows via the substrate under the gate electrode. As a result, a transistor is turned on at a lower voltage than an operation voltage.

Figure 4:
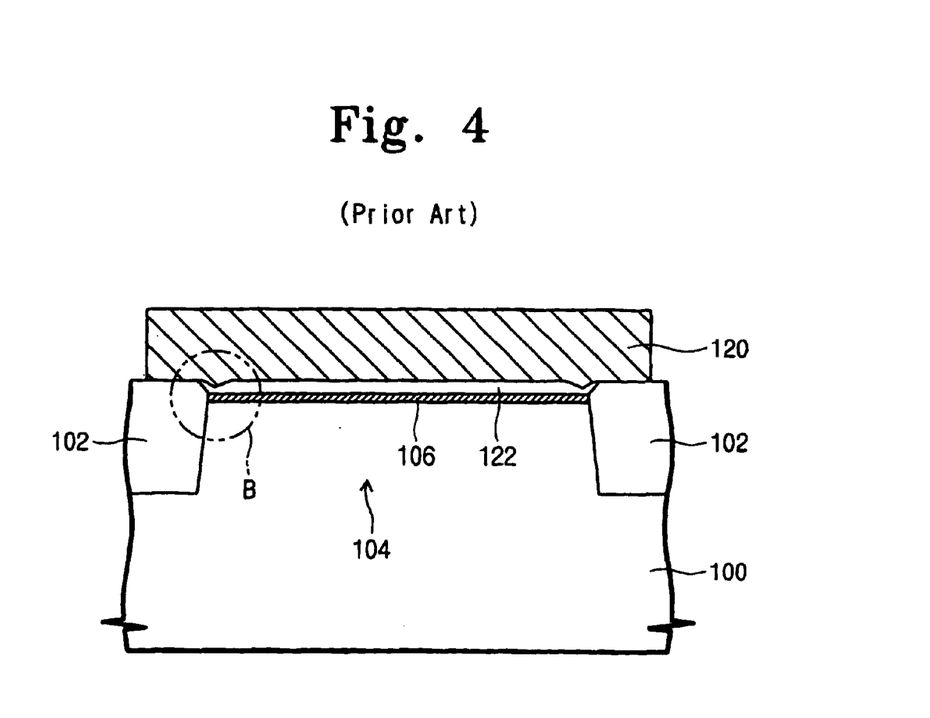
FIG. 4 includes a cross-sectional view taken along a II–II' line of FIG. 1, illustrating a subthreshold leakage current in a semiconductor device.

FIG. 4 illustrates a cross-sectional view taken along a II–II' line of FIG. 1 illustrating a subthreshold leakage current of a semiconductor device. Referring to FIG. 4, when a shallow trench isolation technology is applied, the gate oxide layer 122 becomes thin at the boundary B between the active region 104 and the isolation layer 102, and this may result in an inverse narrow width effect. Thus, the transistor is turned on at a lower gate voltage than the operation voltage, and thus, a subthreshold leakage current flows via the substrate under the gate electrode 124.

SUMMARY OF THE INVENTION

It is an object of the present invention to provide a semiconductor device having a structure capable of preventing a GIDL current, and a method of fabricating the same.

It is another object of the present invention to provide a semiconductor device having a structure reducing a subthreshold leakage current flowing in a boundary of an active region near an isolation layer, and a method of fabricating the same.

It is still another object of the present invention to provide a semiconductor device showing a superior operation characteristic at a high operation voltage, and a method of fabricating the same.

The present invention is directed to a semiconductor device having a thick oxide pattern under an edge of a gate electrode. The semiconductor device includes a trench isolation layer that is formed at a predetermined region of a semiconductor substrate to define an active region. A gate electrode is arranged to cross over the active region. First and second conductive regions are formed in the active regions of both sides of the gate electrode overlapped with the edges of the gate electrode. An oxide pattern is interposed at least between the edges of the gate electrode and each of the first and second conductive regions. A gate oxide layer is interposed between the active region and the gate electrode. The oxide pattern is thicker than the gate oxide layer.

Each of the first and second conductive regions can include a heavy doped diffusion layer and a lightly doped diffusion layer. The heavy doped diffusion layer may be formed at the top of the lightly doped diffusion layer. The heavy doped diffusion layer may be formed in the active region apart from the oxide pattern, or in the active region contacting the oxide pattern. The oxide pattern may be interposed between the gate electrode and each of the first and second conductive regions. The both ends of the oxide pattern may be extended to the bottom of the gate electrode to cover the boundary between the isolation layer and the active region. That is, the oxide pattern may have a closed loop shape.

The present invention is directed to a method of fabricating a semiconductor device. In the method, a thick oxide pattern is formed at a region where a gate electrode and a drain are overlapped. In order to realize this, a trench isolation layer is formed at a predetermined region of a semiconductor substrate to define an active region. A pair of preliminary lightly doped diffusion layers are formed in the active region. The preliminary lightly doped diffusion layers cross over the active region in parallel with each other. Oxide patterns are formed to cover each top of the preliminary lightly doped diffusion layers and to define a channel region at a predetermined portion of the active region. A gate oxide layer is formed on the channel region. Then, a gate electrode, whose edge is overlapped with the oxide pattern, is formed to cover the entire surface of the gate oxide layer and to cross over the active region. Impurities are implanted in the active region using the gate electrode as an ion-implantation mask, to form a lightly doped diffusion layer including the preliminary lightly doped diffusion layer, and to form a heavy doped diffusion layer which is shallower than the lightly doped diffusion layer, at the top of the lightly doped diffusion layer. The oxide pattern is thicker than the gate oxide layer.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. In the attached figures, the thickness of layers and regions is exaggerated for clarity. Also, when it is stated that a layer is on another layer or on a substrate, the layer may be directly formed on another layer or on a substrate, or a third layer may be interposed therebetween.

Embodiment 1.

Figure 5:
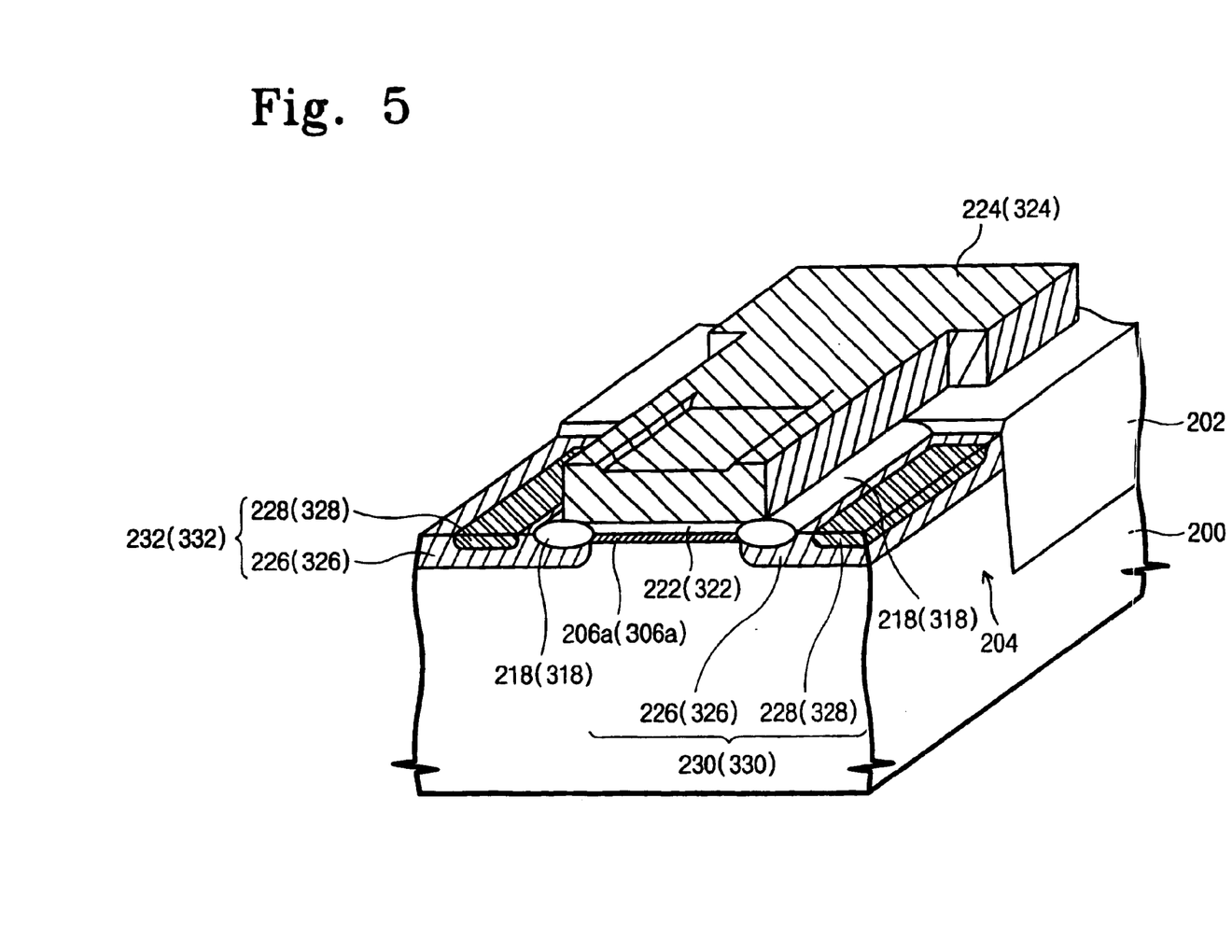
FIG. 5 includes a perspective view illustrating a structure of a semiconductor device according to a preferred embodiment of the present invention.

Referring to FIG. 5, the first embodiment of the present invention includes a trench isolation layer 202 being arranged at a predetermined region of a semiconductor substrate 200 to define an active region 204. A gate electrode 224(324) is arranged to cross over the active region 204. A first conductive region 230(330) and a second conductive region 232(332) are formed in the active region 204 at both sides of the gate electrode 224(324). The first conductive region 230(330) corresponds to a source region and the second conductive region 232(332) corresponds to a drain region. An oxide pattern 218(318) is interposed between the gate electrode 224(324) and each of the source region 230(330) and the drain region 232(332). Both ends of the oxide pattern 218(318) are extended to the bottom of the gate electrode 224(324) and are connected with each other to further cover the boundary between the active region 204 and the isolation layer 202. A shallow channel diffusion layer 206a(306a) is formed in the active region 204 under the gate electrode 224(324). The channel diffusion layer 206a(306a) is extended to the bottom of the oxide patterns 218 and 318 to preferably contact with the source region 230(330) and the drain region 232(332). A gate oxide layer 222(322) is interposed between the channel diffusion layer 206a(306a) and the gate electrode 224(324). The oxide patterns 218(318) are preferably thicker than the gate oxide layer. At least the drain region 232(332) is preferably formed into a double doped drain(DDD) structure, including a lightly doped diffusion layer 226(326) and a heavy doped diffusion layer 228(328). The lightly doped diffusion layer 226(326) is present in the active region downward and outward from the oxide pattern 218(318). The heavy doped diffusion layer 228(328) is formed at the top of the lightly doped diffusion layer 226(326) out of the oxide pattern 218(318). That is, the heavy doped diffusion layer 228(328) is formed shallower than the lightly doped diffusion layer. The heavy doped diffusion layer 228(328) may be formed in the active region, apart from the oxide pattern 218(318). On the contrary, the heavy doped diffusion layer 228(328) may be formed in the active region 204 adjacent to the oxide pattern 218(318). The lightly doped diffusion layer 226(326) contact with the channel diffusion layers 206a and 306a under the oxide patterns 218 and 318. On the contrary, the lightly doped diffusion layers 226 and 326 may be spaced apart from the channel diffusion layer 206a(306a) by a predetermined distance.

According to the present invention as described, an oxide pattern 218(318) is interposed between the gate electrode 224 and the drain region 232(332). Thus, a low electric field is applied between the gate electrode 224 and the drain region 232(332). Thus, a GIDL current resulting from a band-to-band tunneling may not flow between the drain region 232(332) adjacent to the gate electrode 224(324) and the semiconductor substrate 200.

Additionally, when the oxide pattern 218(318) covers the boundary between the active region 204 and the trench isolation layer 202 under the gate electrode 224(324), an inverse narrow width effect may be prevented and a subthreshold current may not flow in a semiconductor substrate.

FIGS. 6A, 7A, 8A, 9A and 10A include plan views illustrating a method of fabricating a semiconductor device according to a first embodiment of the present invention. FIGS. 6B, 7B, 8B, 9B and 10B include cross-sectional views taken along III–III' lines of FIGS. 6A, 7A, 8A, 9A and 10A, respectively, illustrating a method of fabricating a semiconductor device according to a first embodiment of the present invention.

Figure 6A:
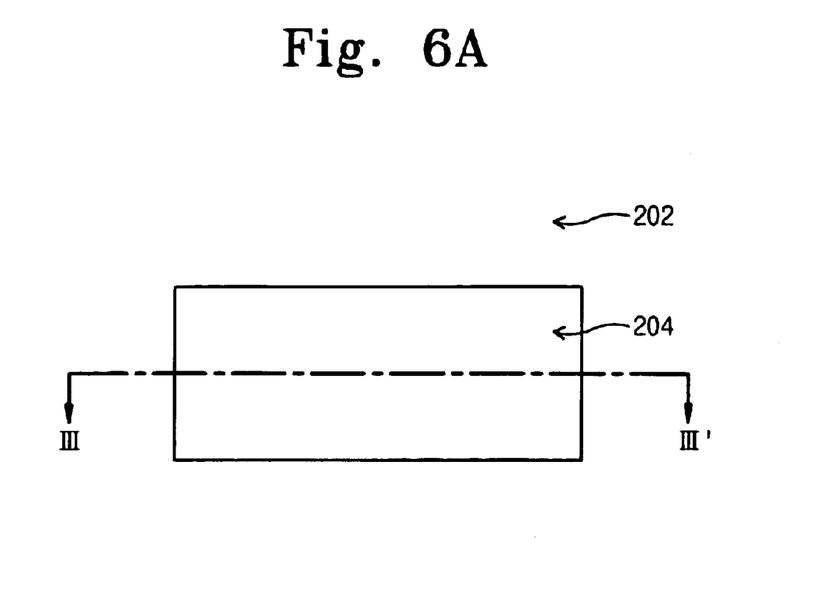
FIGS. 6A, 7A, 8A, 9A and 10A include plan views illustrating a method of fabricating a semiconductor device according to a first embodiment of the present invention.
Figure 6B:
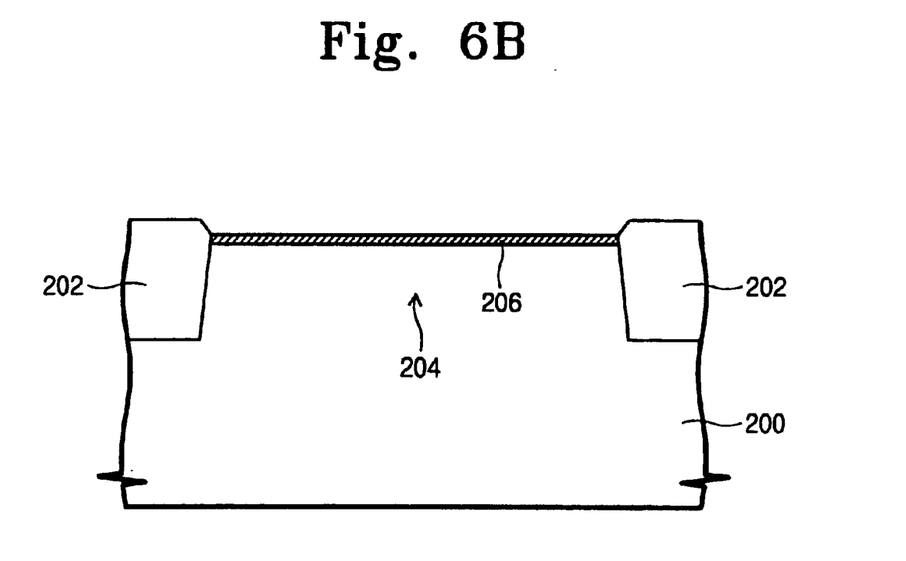
FIGS. 6B, 7B, 8B, 9B and 10B include cross-sectional views taken along III–III' lines of FIGS. 6A, 7A, 8A, 9A and 10A, respectively, illustrating a method of fabricating a semiconductor device according to a first embodiment of the present invention.

Referring to FIGS. 6A and 6B, an isolation layer 202 is formed at a predetermined region of a semiconductor substrate 200 to define an active region 204. A shallow impurity diffusion layer 206 is formed in the active region 204. The isolation layer 202 is formed by employing a shallow trench isolation technology.

Figure 7A:
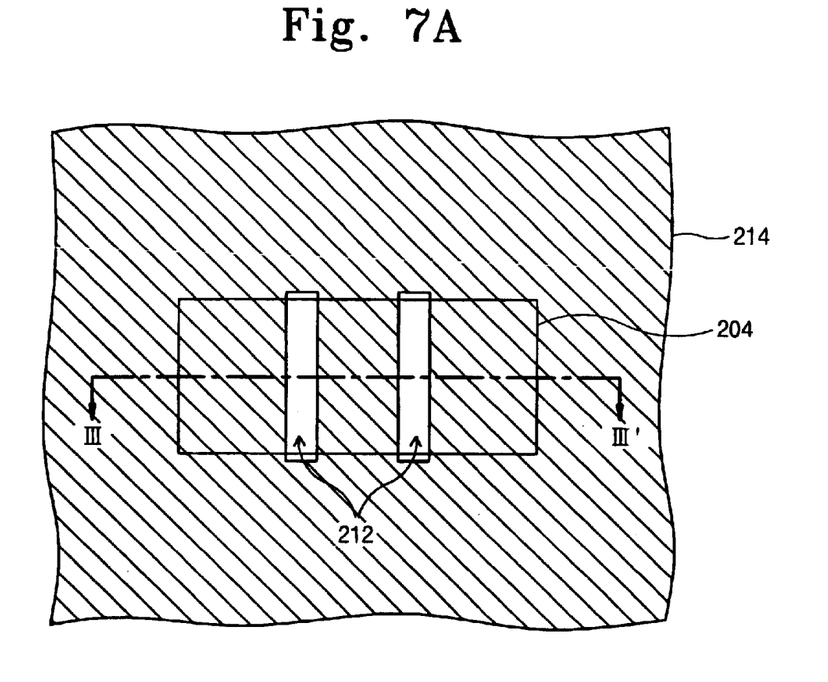
Figure 7B:
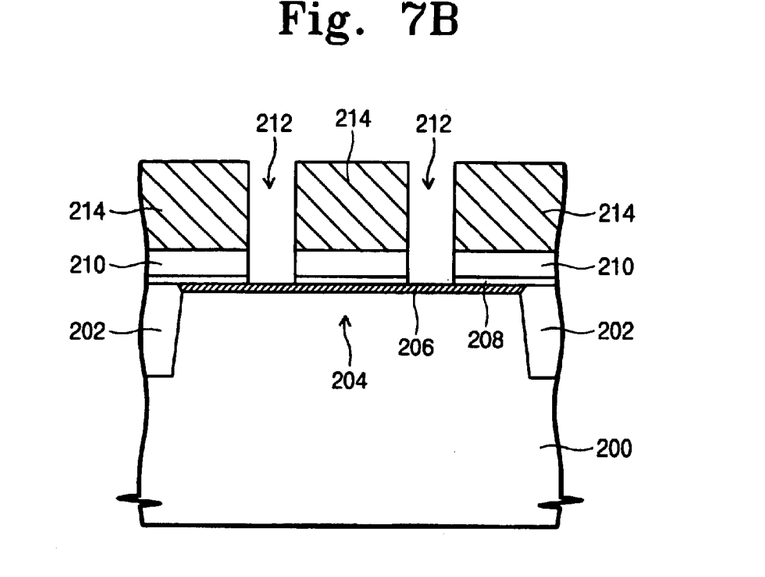

Referring to FIGS. 7A and 7B, a buffer oxide layer and an oxidation barrier layer are formed at the entire surface of the semiconductor substrate 200 where the shallow impurity diffusion layer 206 is formed. The buffer oxide layer is preferably formed of a thermal oxide layer. The oxidation barrier layer is preferably formed of a silicon nitride layer. Then a first photoresist pattern 214 is formed on the oxidation barrier layer. The first photoresist pattern 214 covers the isolation layer 202, and a pair of exposure regions 212 crossing over the active region 204. The exposure regions 212 expose predetermined regions of the oxidation barrier layer. Then, the oxidation barrier layer and the buffer oxide layer are etched using the first photoresist pattern 214 as an etch mask to form a buffer oxide pattern 208 and an oxidation barrier pattern 210 which are sequentially stacked. The stacked buffer oxide pattern 208 and the oxide barrier pattern 210 cover the isolation layer 202 and expose a predetermined portion of the active region 204.

Figure 8A:
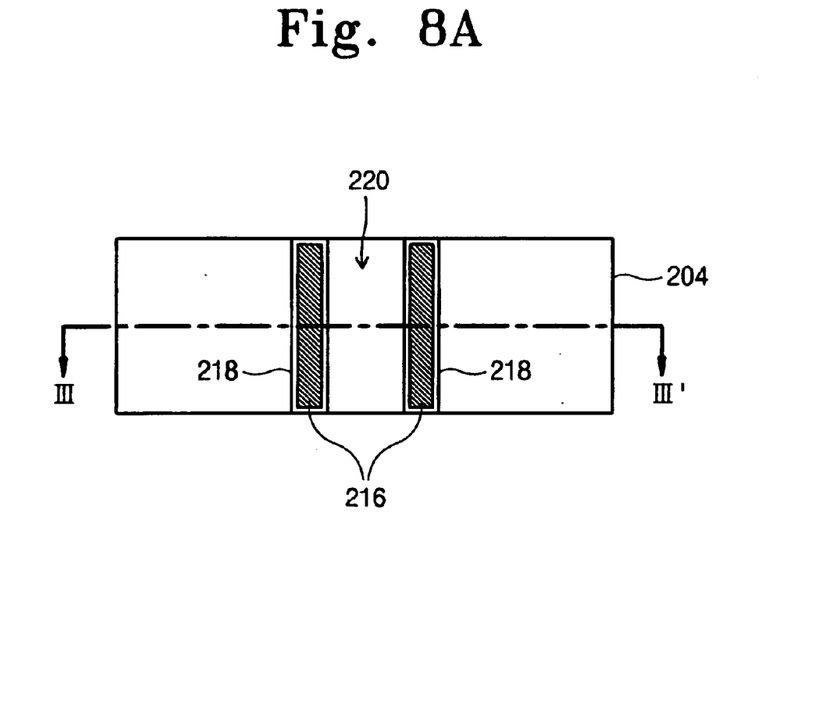
Figure 8B:
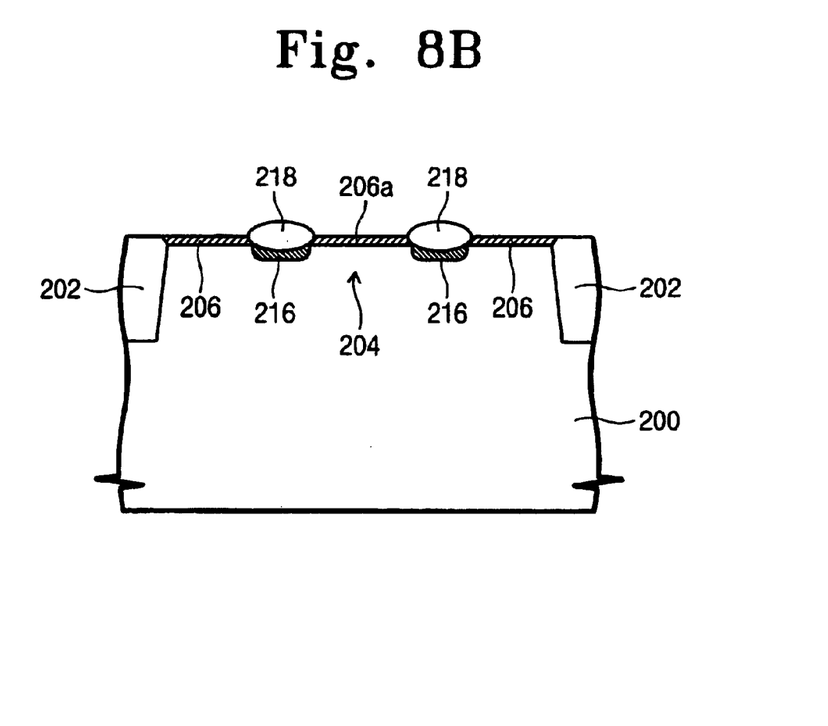

Referring to FIGS. 8A and 8B, a pair of preliminary lightly doped diffusion layers 216 are formed in parallel in the active region 204 using the first photoresist pattern 214 as an ion-implantation mask. Then, the first photoresist pattern 214 is removed and a thermal oxidation process is applied with respect to the semiconductor substrate 200 to form a pair of oxide patterns 218 crossing the active region 204. While the thermal oxidation process is preceded, the active region 204 under the oxidation barrier pattern 210 is not oxidized, but the exposed active region is oxidized. That is, the oxidation pattern 218 covers the top of the preliminary lightly doped diffusion layer 216. The preliminary lightly doped diffusion layer 216 preferably remains under the oxide pattern 218(318). A channel region 220 is defined between the oxide patterns 218. The shallow impurity diffusion layer in the channel region 220 corresponds to a channel diffusion layer 206a. Then, the oxidation barrier pattern 210 and the buffer oxide pattern 208 are sequentially removed to expose the active region 204 and the isolation layer 202.

The oxidation barrier pattern 210 may be removed, leaving the buffer oxide pattern 208. Then, the buffer oxide pattern 208 of a region defined by the oxide pattern corresponds to a gate oxide layer.

Figure 9A:
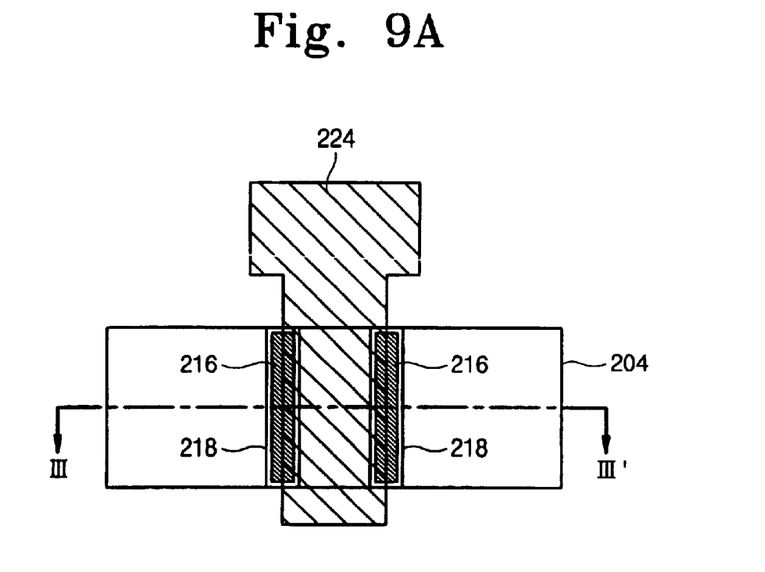
Figure 9B:
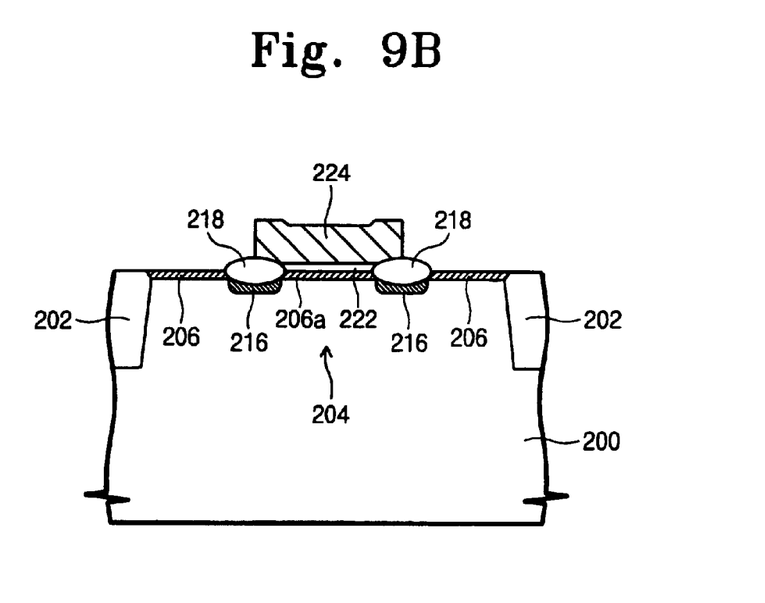

Referring to FIGS. 9A and 9B, a gate oxide layer is formed at least at the entire surface of the active region 204, and a gate conductive layer is formed at the entire surface of the semiconductor substrate 200 where the gate oxide layer is formed. The gate conductive layer is preferably formed of a polysilicon or a polycide. At least the gate conductive layer is patterned to form a gate electrode 224 crossing over the active region 204. As described, the gate electrode 224 covers the top of the channel diffusion layer 206a, and the edge of the gate electrode 224 is located on the oxide patterns 218. A gate oxide layer 222 is interposed between the gate electrode 224 and the channel region 220.

Figure 10A:
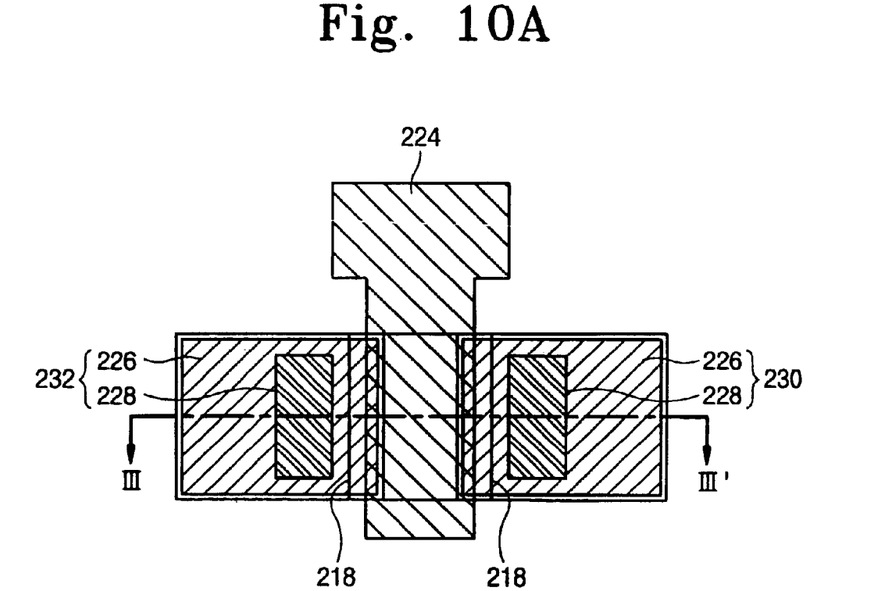
Figure 10B:
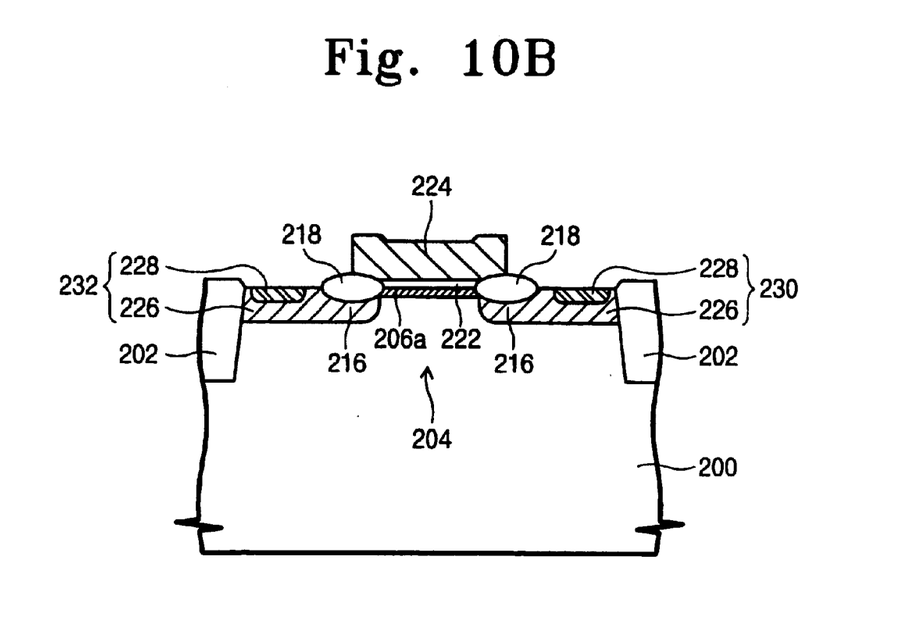

Referring to FIGS. 10A and 10B, impurities are implanted in the active region 204 using the gate electrode 224 as an ion-implantation mask to form a lightly doped diffusion layer 226 including the preliminary lightly doped diffusion layer 216. The lightly doped diffusion layer 226 is formed in the active region 204 outward and downward from the oxide patterns 218. A heavy doped diffusion layer 228 is formed in the active region exposed at both sides of the gate electrode 224. The heavy doped diffusion layer 228 is shallower than the lightly doped diffusion layer 226. That is, the heavy doped diffusion layer 228 is present on the lightly doped diffusion layer 226. The heavy doped diffusion layer 228 may be surrounded by the lightly doped diffusion layer 226 at a predetermined portion of the active region of both sides of the gate electrode by using a photolithography process. Also, the heavy doped diffusion layer 228 may be formed at the entire surface of both sides of the gate electrode 224 using the gate electrode 224 and the oxide patterns 218 as ion-implantation masks.

Embodiment 2.

Figure 11A:
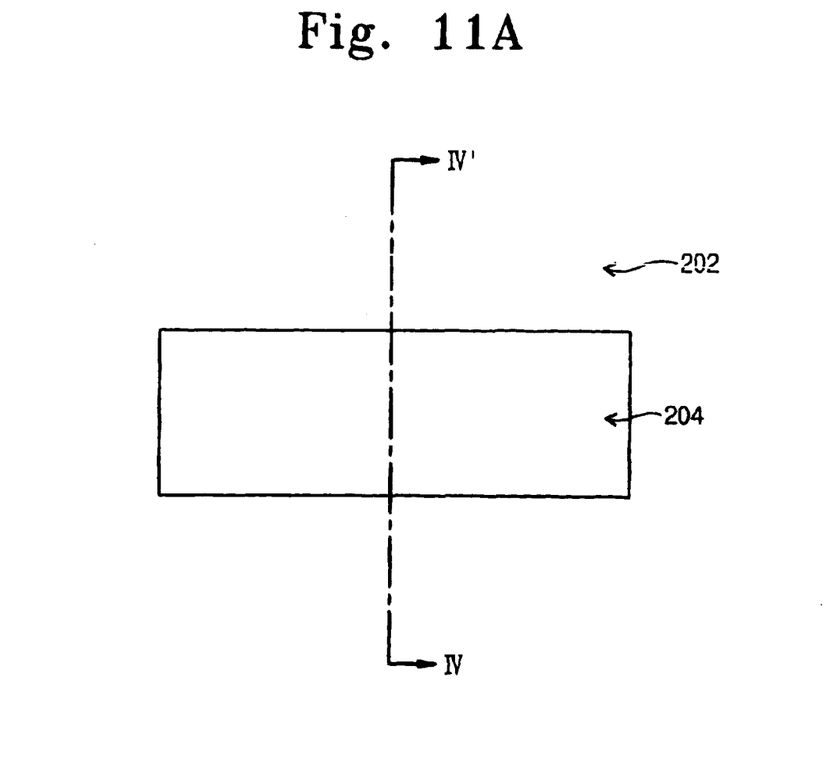
FIGS. 11A, 12A, 13A, 14A and 15 include plan views illustrating a method of fabricating a semiconductor device according to a second embodiment of the present invention.
Figure 11B:
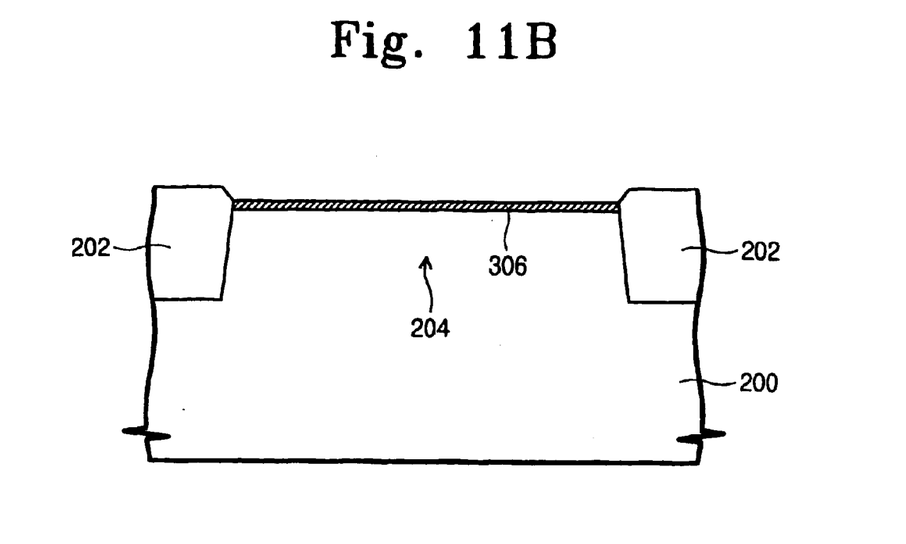
FIGS. 11B, 12B, 13B, and 14B include cross-sectional views taken along IV–IV' lines of FIGS. 11A, 12A, 13A, and 14A, respectively, illustrating a method of fabricating a semiconductor device according to a second embodiment of the present invention.

Referring to FIGS. 11A and 11B, the second embodiment of the present invention includes an isolation layer 202 being formed at a predetermined region of a semiconductor substrate 200 to define an active region 204. The isolation layer 202 is formed using a shallow trench isolation technology. Then, a shallow impurity diffusion layer 306 is formed in the active region 204.

Figure 12A:
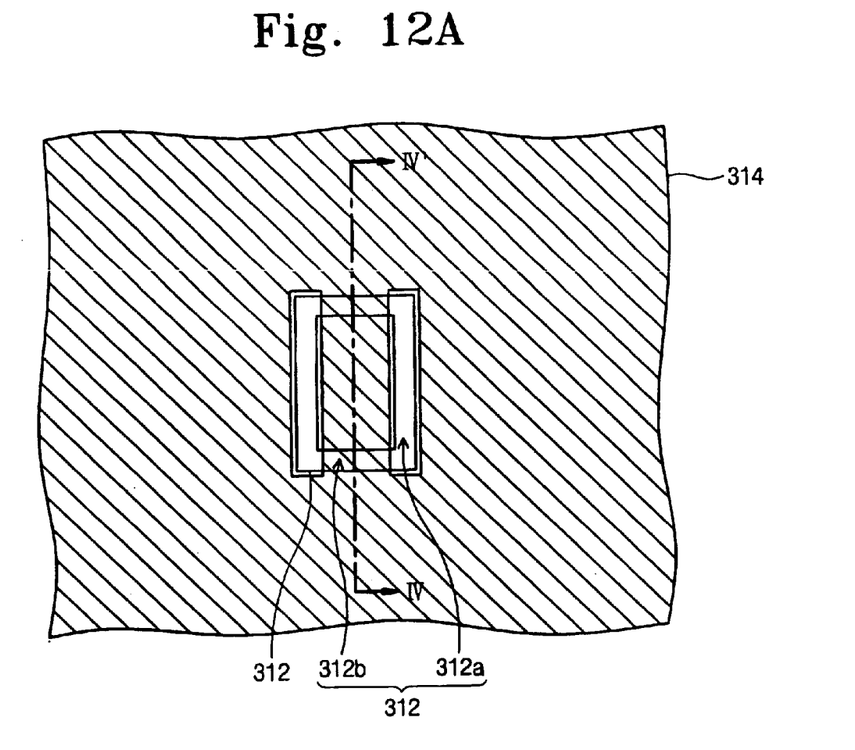
Figure 12B:
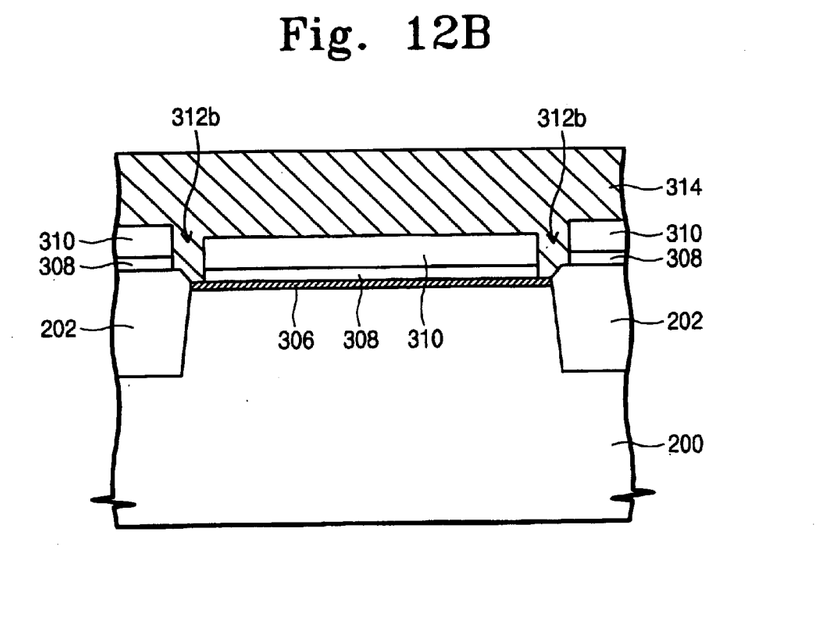

Referring to FIGS. 12A and 12B, a buffer oxide layer and an oxidation barrier layer are formed at the entire surface of a semiconductor substrate 200 where the shallow impurity diffusion layer 306 is formed. Processes of forming the buffer oxide layer and the oxidation barrier layer are the same as in the first embodiment. At least the oxidation barrier layer and the buffer oxide layer are sequentially patterned to form a buffer oxide pattern 308 and an oxidation barrier pattern 310 which are sequentially stacked. The stacked buffer oxide pattern 308 and the oxidation barrier pattern 310 have an opening 312. The opening 312 includes a pair of first portions 312a and a pair of second portions 312b. The first portion 312a crosses over the active region 204, and the second portion 312b is present between the first portions 312a and exposes the boundary between the active region 204 and the isolation layer 202. A photoresist pattern 314 is formed to cover the boundary between the active region 204 and the isolation layer 202 which are exposed by the second portion 312b.

Figure 13A:
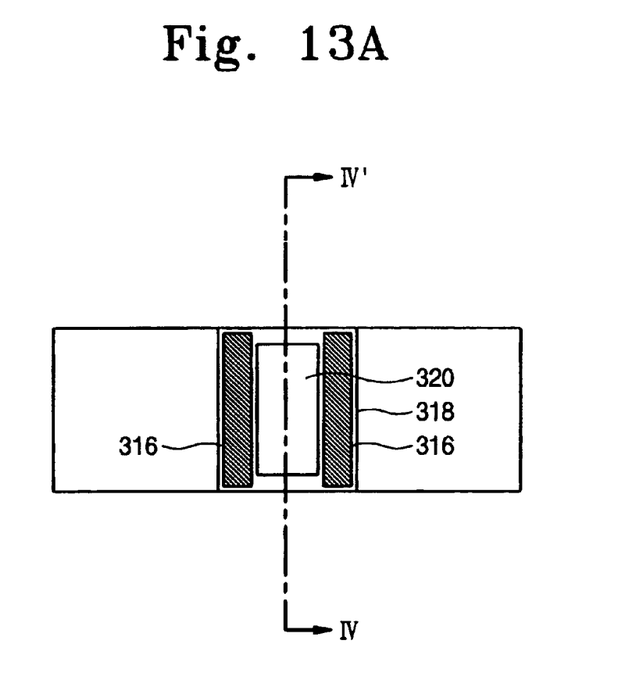
Figure 13B:
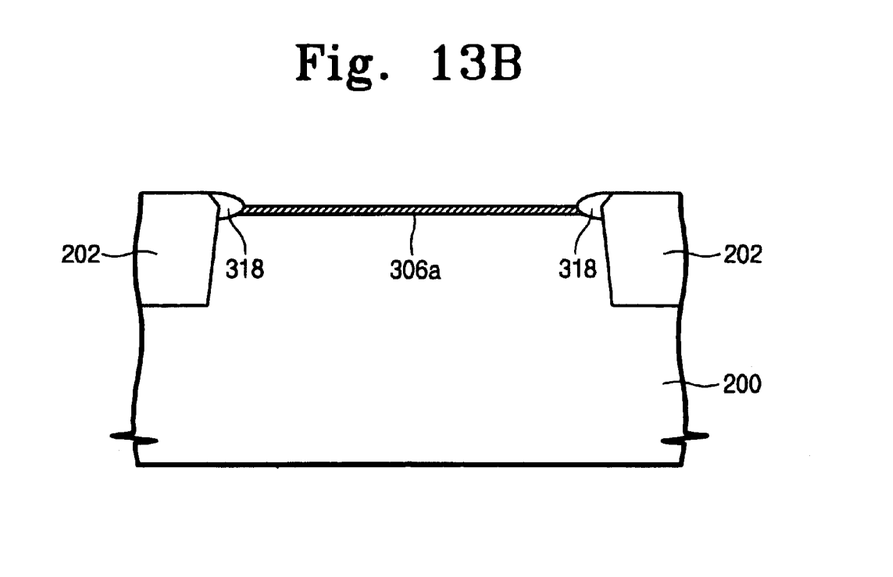

Referring to FIGS. 13A and 13B, a pair of preliminary lightly doped diffusion layers 316 are formed in parallel in the active region 204 using the photoresist patterns 314, the buffer oxide pattern 308 and the oxidation barrier pattern 310 as ion-implantation masks. Each of the preliminary lightly doped diffusion layers 316 is formed along each of the first portions 312a. Then, the photoresist pattern 314 is removed and a thermal oxidation process is applied to the semiconductor substrate 200. As a result, an oxide pattern 318 is formed to surround a predetermined region of the active region. The preliminary lightly doped diffusion layer 316 remains under the oxide pattern 318. A region surrounded by the oxide pattern 318 corresponds to a channel region 320. The shallow impurity diffusion layer in the channel region 320 corresponds to a channel diffusion layer 306a. The oxide pattern 318 covers the boundary between the isolation layer 202 and the active region 204 adjacent to the channel diffusion layer 306a. Thus, the boundary between the channel region 320 and the neighboring active region 204 is oxidized to be smooth. Then, the stacked oxidation barrier pattern 310 and the buffer oxide pattern 308 are removed to expose the active region 204. The oxidation barrier pattern 310 may be removed leaving the buffer oxide pattern 308. Then, the buffer oxide pattern 308 corresponds to a gate insulation layer 322.

Figure 14A:
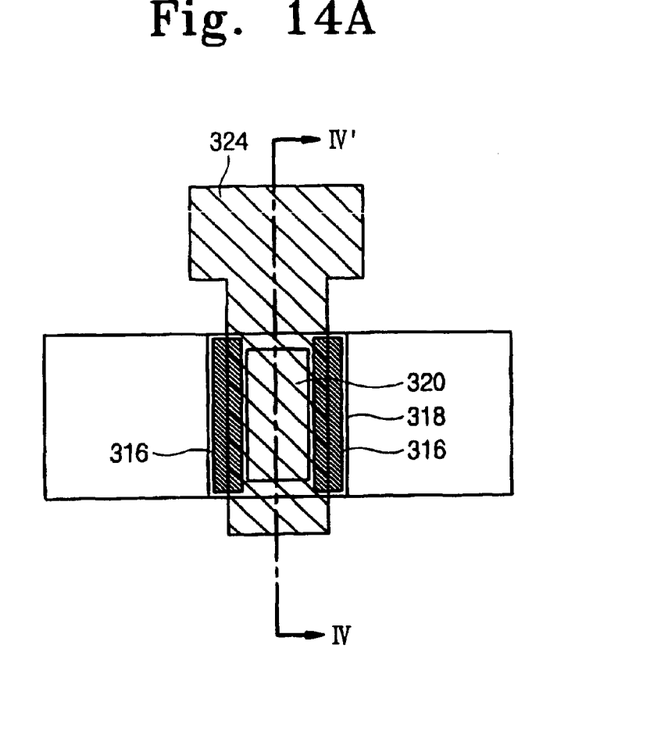
Figure 14B:
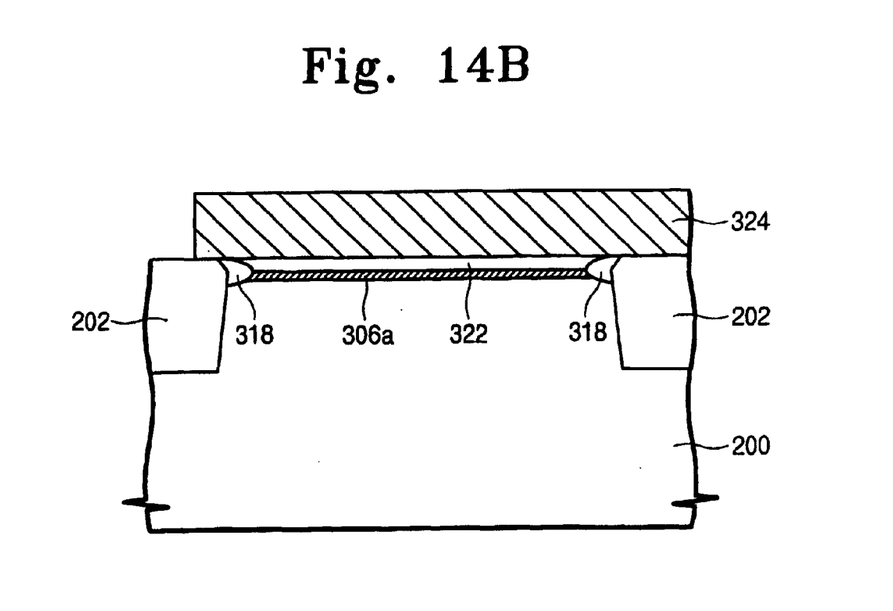

Referring to FIGS. 14A and 14B, a gate oxide layer 322 is formed at least on the exposed active region 204, and a gate conductive layer is formed at the entire surface of the semiconductor substrate 200 where the gate oxide layer is formed. At least the gate conductive layer is patterned to form a gate electrode 324 crossing over the active region 204. The gate electrode 324 covers the entire surface of the channel region 320. A gate oxide layer 322 is interposed between the gate electrode 324 and the channel region 320. The edge of the gate electrode 324 is located on the oxide pattern 318.

Figure 15:
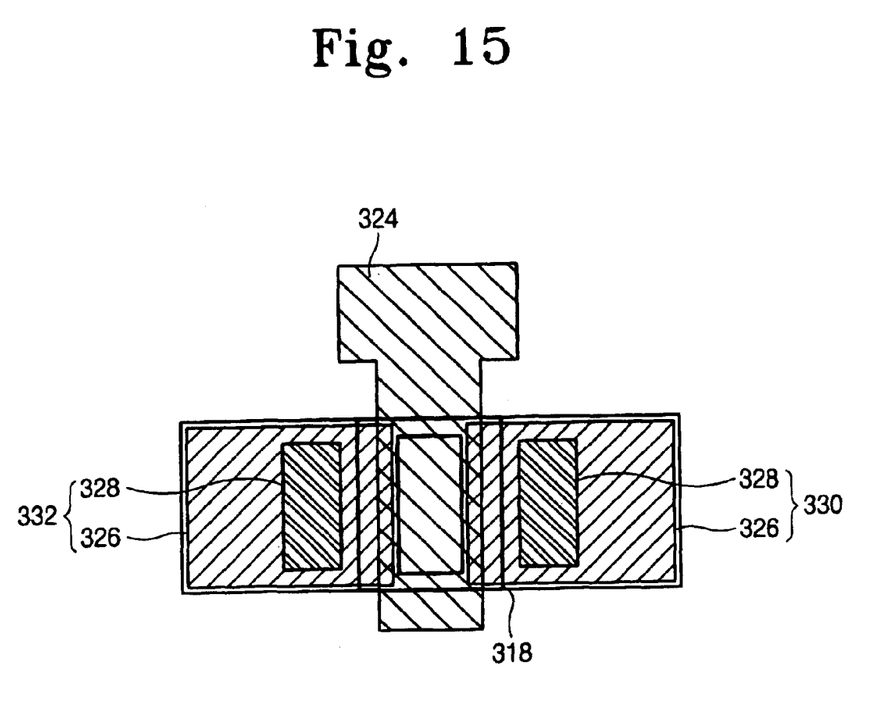

Referring to FIG. 15, impurities are implanted in the active region using the gate electrode 324 as an ion-implantation mask. As a result, a lightly doped diffusion layer 326 including the preliminary lightly doped diffusion layer 316 is formed in the active region 304 at both sides of the gate electrode 324. The lightly doped diffusion layer 326 is present in the active region 204 downward and outward from the oxide pattern 318 which is located at the edge of the gate electrode 324. The lightly doped diffusion layer 326 may contact or may be spaced apart from the channel diffusion layer 306 and the oxide pattern 318.

Heavy doped diffusion layers 328 are formed in the active regions 204 at both sides of the gate electrode 324 by the same method as the first embodiment. The heavy doped diffusion layer 328 is shallower than the lightly doped diffusion layer 326. Also, the heavy doped diffusion layer 328 is preferably spaced apart from the isolation layer 202 and the gate electrode 324 by a predetermined distance and surrounded by the lightly doped diffusion layer 326. The heavy doped diffusion layer 328 and the lightly doped diffusion layer 326 compose a source region 330 and a drain region 332 at both sides of the gate electrode 324.

Consequently, in the second embodiment of the present invention, a thick oxide pattern is present between the gate electrode and the drain region, and an oxide pattern is present on the boundary between the active region and the isolation layer. Thus, like the first embodiment, it is possible to prevent a GIDL current and to reduce a subthreshold leakage current flowing along the boundary of the active region.

As described above, in the present invention, a thick oxide pattern is formed between the gate electrode and the drain region, to prevent a GIDL current. Also, a thick oxide layer is formed at the boundary between the active region and the isolation layer which are present under the gate electrode, to prevent a subthreshold leakage current resulting from an inverse narrow width effect.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A semiconductor device comprising:

a semiconductor substrate;

a trench isolation layer at a predetermined region of the semiconductor substrate to define an active region;

a gate electrode crossing over the active region;

first and second conductive regions formed in the active region at both sides of the gate electrode and overlapped with the edge of the gate electrode;

an oxide pattern interposed between the gate electrode and each of the first and second conductive regions, a top surface of the oxide pattern being underneath and in contact with an edge of the gate electrode; and a gate oxide layer interposed between the active region and the gate electrode, wherein the oxide pattern is thicker than the gate oxide layer.

2. The semiconductor device as claimed in claim 1, wherein each of the first and second conductive regions includes a heavy doped diffusion layer and a lightly doped diffusion layer, and the heavy doped diffusion layer is formed at the top of the lightly doped diffusion layer.

3. The semiconductor device as claimed in claim 2, wherein the heavy doped diffusion layer is formed in the active region apart from the oxide pattern.

4. The semiconductor device as claimed in claim 2, wherein the heavy doped diffusion layer is formed in the active region and contacts with the oxide pattern.

5. The semiconductor device as claimed in claim 1, further comprising a channel diffusion layer in the active region under the gate electrode.

6. The semiconductor device as claimed in claim 1, wherein the oxide pattern is interposed between the edge of the gate electrode and the active region.

7. The semiconductor device as claimed in claim 1, wherein both ends of the oxide pattern cover a boundary between the active region and the isolation layer.

* * * * *